(12) United States Patent
Dolgoshein et al.

(10) Patent No.: US 9,793,419 B2
(45) Date of Patent: Oct. 17, 2017

(54) SILICON PHOTOELECTRIC MULTIPLIER WITH MULTIPLE READ-OUT

(71) Applicants: Max-Planck-Gesellschaft zur Förderung der Wissenschaften e.V, München (DE); Ljudmila Aseeva, Moscow (RU)

(72) Inventors: Boris Anatolievich Dolgoshein, Moscow (RU); Masahiro Teshima, Unterschleissheim (DE); Razmick Mirzoyan, Unterschleissheim (DE); Anatoliy Dmitrievich Pleshko, Moscow (RU); Pavel Zhorzhevich Buzhan, Moscow Region (RU); Valentin Nikolaevich Staroseltsev, Msocow (RU); Vladimir Alexandrovich Kaplin, Moscow (RU); Stifutkin Alexey Anatolievich, Moscow (RU)

(73) Assignee: MAX-PLANCK-GESELLSCHAFT ZUR FOERDERUNG DER WISSENSCHAFTEN E.V., Munich (DE)

( * ) Notice: Subject to any disclaimer, the term of this patent is extended or adjusted under 35 U.S.C. 154(b) by 409 days.

(21) Appl. No.: 13/763,640

(22) Filed: Feb. 9, 2013

(65) Prior Publication Data
US 2013/0228889 A1    Sep. 5, 2013

Related U.S. Application Data

(63) Continuation-in-part of application No. PCT/EP2010/061626, filed on Aug. 10, 2010.

(51) Int. Cl.
*H01L 31/02* (2006.01)
*H01L 27/144* (2006.01)

(52) U.S. Cl.
CPC .......... *H01L 31/02* (2013.01); *H01L 27/1446* (2013.01)

(58) Field of Classification Search
CPC ..................................................... H01L 31/02
See application file for complete search history.

(56) References Cited

U.S. PATENT DOCUMENTS

| 2,290,775 | A | * | 7/1942 | Snyder, Jr. | .................... 369/120 |
| 2,403,239 | A | * | 7/1946 | Rose | .............................. 313/329 |
| 2,629,672 | A | * | 2/1953 | Morgan | ................ H01L 21/185 |
| | | | | | 117/54 |

(Continued)

FOREIGN PATENT DOCUMENTS

WO    2008004547    1/2008

OTHER PUBLICATIONS

International Search Report cited in related application No. PCT/EP2010/061626 dated Jan. 15, 2012, pp. 1-5.

(Continued)

*Primary Examiner* — Eugene Lee
(74) *Attorney, Agent, or Firm* — Cooper Legal Group, LLC

(57) ABSTRACT

A silicon-based photoelectric multiplier comprises a plurality of cells and a number of read-out lines, and at least one of a number read-out pads or a ring-like line, wherein the plurality of cells may be divided into a number of segments, and each one of the read-out lines may be electrically connected with the cells of at least one segment.

20 Claims, 8 Drawing Sheets

(56) References Cited

U.S. PATENT DOCUMENTS

| | | | | |
|---|---|---|---|---|
| 3,488,636 | A * | 1/1970 | Dyck | G11C 13/047 |
| | | | | 250/208.3 |
| 4,511,914 | A * | 4/1985 | Remedi | H01L 23/52 |
| | | | | 257/203 |
| 4,710,675 | A * | 12/1987 | Stephenson | 313/532 |
| 4,956,602 | A * | 9/1990 | Parrish | G01R 31/2831 |
| | | | | 257/E21.526 |
| 5,497,014 | A * | 3/1996 | Momose | H01L 27/11896 |
| | | | | 257/204 |
| 6,211,554 | B1 * | 4/2001 | Whitney | H01C 7/1013 |
| | | | | 257/355 |
| 7,012,304 | B1 * | 3/2006 | Dabral | H01L 27/0255 |
| | | | | 257/355 |
| 7,012,330 | B1 * | 3/2006 | Sidiropoulos | H01L 24/02 |
| | | | | 257/693 |
| 7,808,056 | B2 * | 10/2010 | Furuta | H01L 21/823425 |
| | | | | 257/288 |
| 8,455,955 | B2 * | 6/2013 | Stribley | H01L 27/0203 |
| | | | | 257/390 |
| 2008/0218098 | A1 * | 9/2008 | Lee | H05B 33/0803 |
| | | | | 315/250 |
| 2011/0272561 | A1 | 11/2011 | Sanfilippo et al. | |

OTHER PUBLICATIONS

LL05A G., et al., Energy and Timing Resolution Studies with Silicon Photomultipliers (SiPMS) and 4-Pixel SiPM Matrieces for PET, IEEE Transactions on Nuclear Science, vol. 56, No. 3, Jun. 1, 2009, pp. 543-548.

Korpar S., et al., "A module of silicon photo-multipliers for detection of Cherenkov radiation", Nuclear Instruments & Methods in Physics Research, Sec. A, vol. 613, No. 2, Feb. 1, 2010, pp. 195-199.

Sato K et al., "Application oriented development of multi-pixel photon counter (MPPC)", Nuclear Science Symposium Conference Record, 2010 IEEE, Oct. 30, 2010, pp. 243-245.

Int. Preliminary Report on Patentability cited in PCT Application No. PCT/US2010/061626 dated Feb. 12, 2013, 6 pgs.

* cited by examiner

US 9,793,419 B2

SILICON PHOTOELECTRIC MULTIPLIER WITH MULTIPLE READ-OUT

RELATED APPLICATION

This application corresponds to International Patent Application PCT/EP2010/061626, filed on Aug. 10, 2010, at least some of which may be incorporated herein.

DESCRIPTION

Silicon photoelectric multiplier with multiple "isochronic" read-out.

SUMMARY

The disclosed subject matter relates to the field of semiconductor optoelectronic devices, and in particular to photo-detectors with high efficiency light detection, including the visible spectrum. Photo-detectors according to the disclosed subject matter, namely silicon photoelectric multipliers (SiPM), can be used in a wide field of applications which employ the detection of very weak and fast optical signals, such as, for example, industrial and medical tomography, life science, nuclear, particle and astro-particle physics, etc.

The time delay of individual output signals of an SiPM and as a result also the time resolution of a large size SiPM depends on which part of the SiPM the photons hit. If they hit close to the read-out pad then there is almost no delay of the output signal. On the other hand, if the photons hit a corner that is a large distance from the read-out pad, then the signal appears with a non-negligible time delay. In a typical case, a large size SiPM, e.g. 3 mm×3 mm or larger, is coupled to a scintillator in a positron emission tomography (PET) application, the entire area of the SiPM is illuminated, and its time resolution is degraded to a significant extent. The effect is due to parasitic cell capacitances and inductances, which form delay resonance lines. These capacitances and inductances delay the partial output signals to different amounts thus widening the summed output signal and hence a curve of time resolution.

One aspect of the disclosed subject matter is to split the entire area of the silicon-based photoelectric multiplier into several segments and to provide several read-out lines in such a way that respective segments are associated and electrically connected with one read-out line. In this way the distances between the cells and their respective associated read-out lines can be reduced so that time delays resulting from a cell's parasitic capacitances and inductances can be reduced accordingly. As a result the loss in time resolution due to one or more effects can be avoided or limited. A desired time resolution can be obtained by arranging a number of read-out lines. A reasonable trade-off can be found between a satisfactory time resolution on the one hand and the expenditure of arranging the necessary number of read-out lines on the other hand. The read-out lines can either be connected with a number of read-out pads or with a contiguous ring-like read-out line surrounding the plurality of cells.

According to a first aspect, a silicon-based photoelectric multiplier is provided which comprises a plurality of cells and a number of read-out pads, wherein the plurality of cells is divided into a number of segments and respective read-out pads are electrically connected with the cells of at least one segment, and with merely one segment, in an example. The read-out pads are not necessarily to be understood as separate lands. They can also be understood as collecting points placed near the respective segments wherein the collecting points can be electrically connected with each other.

According to a second aspect, a silicon-based photoelectric multiplier is provided which comprises a plurality of cells, and a number of read-out lines, wherein the plurality of cells is divided into a number of segments, and respective read-out lines are electrically connected with the cells of at least one segment, and with merely one segment, in an example.

According to an embodiment of at least one of the first or second aspects, the silicon-based photoelectric multiplier is arranged to operate in a Geiger mode or an avalanche mode.

According to an embodiment of at least one of the first or second aspects, the plurality of cells is fabricated on one common silicon substrate.

According to an embodiment of at least one of the first or second aspects, the plurality of cells is provided in the form of a matrix arrangement.

According to an embodiment of at least one of the first or second aspects, the read-out pads are arranged outside the plurality of cells, and along an outer edge surrounding the plurality of cells. More specifically, the plurality of cells can be arranged in the form of a rectangle and the read-out pads can be arranged along one or more of the side edges of the rectangle.

According to an embodiment of at least one of the first or second aspects, respective read-out pads are electrically connected with an electrical line, the electrical line extending from the read-out pad into the plurality of cells. According to a further embodiment thereof, respective electrical lines are electrically connected with a plurality of electrical wires, and respective electrical wires are electrically connected with a particular number of cells. According to a further embodiment, the electrical lines are electrically connected with the cells of merely one segment, respectively, and the electrical lines extend along a side edge of the respective segment or through the respective segment, respectively.

According to an embodiment of at least one of the first or second aspects, in case of a rectangular matrix arrangement of the plurality of cells, the read-out pads are arranged along two, three or four side edges of the matrix arrangement. According to an embodiment thereof, the read-out pads are arranged along four side edges of the matrix arrangement and an equal number of read-out pads are arranged along the respective four side edges of the matrix arrangement. According to another embodiment, the read-out pads are arranged along two opposing side edges of the matrix arrangement.

According to an embodiment of at least one of the first or second aspects, respective electrical lines are connected with a plurality of electrical wires, and respective electrical wires are connected with a plurality of cells. This will be shown in further detail in the specific embodiments.

According to an embodiment of at least one of the first or second aspects, the read-out pads are arranged in a symmetrical manner, and in a symmetrical manner with respect to a center of the arrangement of cells or with respect to a line extending through the arrangement of cells.

According to an embodiment of at least one of the first or second aspects, respective cells comprise a quenching resistor electrically connected with one of the read-out lines or pads, and via the electrical wires and the electrical lines.

According to an embodiment of at least one of the first or second aspects, respective cells comprise a first layer of a first conductivity type, a second layer of a second conductivity type formed on the first layer, wherein the first layer and the second layer form a first p-n conjunction, and a quenching resistor electrically connected to the second layer. According to a further embodiment thereof, the quenching resistor is configured as a quenching resistor layer of a second conductivity type formed on the first layer laterally besides the second layer and connected to a lateral side face of the second layer. According to another embodiment, the quenching resistor is configured as a quenching resistor layer formed above the second layer, wherein the quenching resistor layer may comprise or be formed of or consist of polysilicon.

According to an embodiment of at least one of the first or second aspects, in a standard mode of operation of the photoelectric multiplier the several read-out lines or pads and the connected electronics are to be used each time for one and the same read-out process or so to say for an "isochronic" read-out.

DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description.

DETAILED DESCRIPTION

Figure 1:
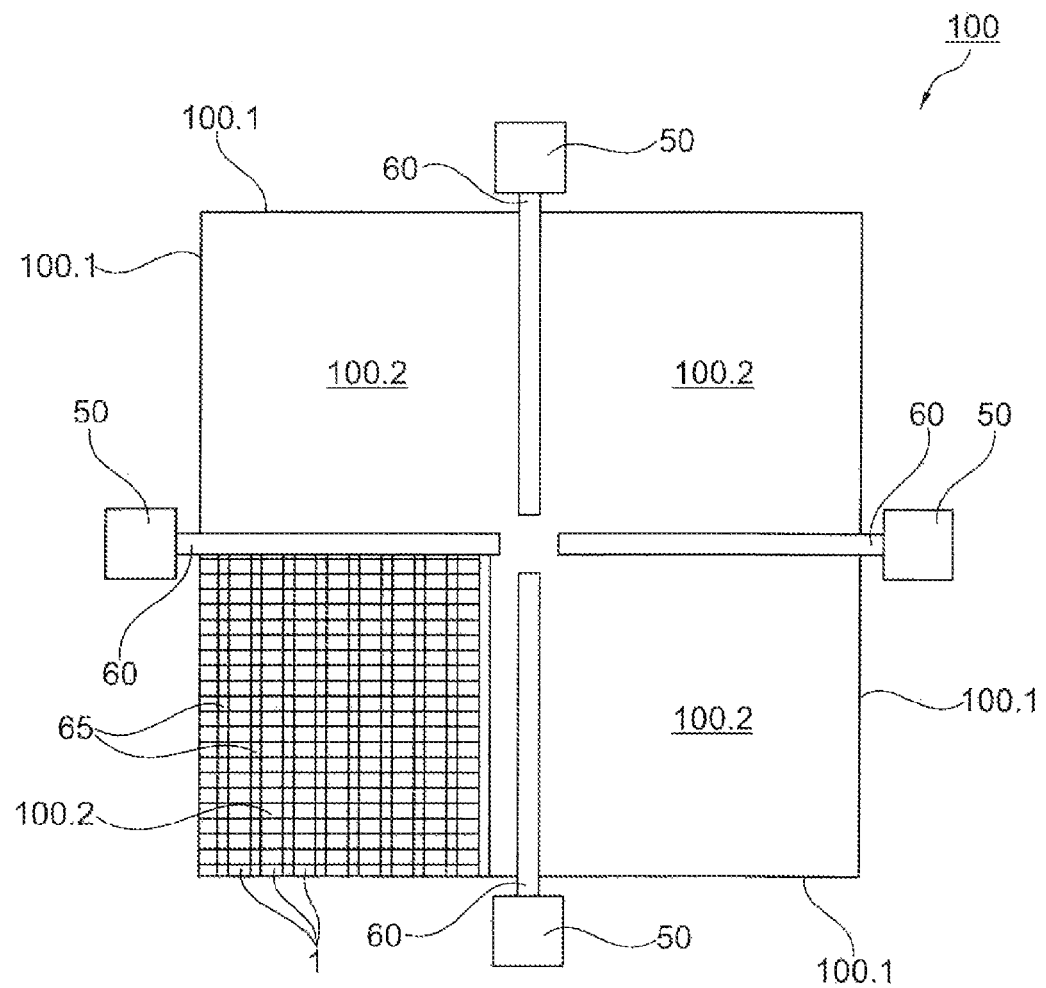
FIG. 1 illustrates a schematic top view representation of a silicon-based photoelectric multiplier according to an embodiment.

The aspects and embodiments are now described with reference to the drawings, wherein like reference numerals are generally utilized to refer to like elements throughout. In the following description, for purposes of explanation, numerous specific details are set forth in order to provide a thorough understanding of one or more aspects of the embodiments. It may be evident, however, that one or more aspects of the embodiments may be practiced with a lesser degree of the specific details. In other instances, known structures and elements are shown in schematic form in order to facilitate describing one or more aspects of the embodiments. The following description is therefore not to be taken in a limiting sense, and the scope is defined by the appended claims. It should also be noted that the representations of the various layers, sheets or substrates in the Figures are not necessarily to scale.

In the following detailed description, reference is made to the accompanying drawings, which form a part thereof, and in which is shown by way of illustration specific embodiments in which the disclosed subject matter may be practiced. In this regard, directional terminology, such as "upper", "lower", "left-hand", "right-hand", "front side", "backside", etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the disclosed subject matter.

Referring to FIG. 1, there is shown a top view representation of a silicon-based photoelectric multiplier according to an embodiment. The device as shown in FIG. 1 is comprised of a matrix arrangement 100 of a plurality of cells 1. The matrix arrangement 100 is divided into four segments 100.2 merely one of which is shown in greater detail, namely the left lower segment. The matrix arrangement 100 of the device has the form of a rectangle, (e.g., a square), comprising four side edges 100.1. The device further comprises read-out pads 50 wherein respective read-out pads 50 are arranged along one of the side edges 100.1 at a center position of the respective side edge 100.1. Respective read-out pads 50 are connected with an electrical line 60, the electrical line 60 extending into the plurality of cells 1. As shown in the left lower part of FIG. 1, respective read-out pads 50 are associated with and electrically connected with the cells 1 of one particular segment 100.2. The respective electrical line 60 is electrically connected with a plurality of electrical wires 65 and respective electrical wires 65 are electrically connected with a particular number of cells 1 along a particular row or column of the particular segment 100.2. The read-out pads 50 and the electrical lines 60 and the electrical wires 65 serve as power lines for applying a positive or negative bias voltage to the p-n junctions of the cells 1. At the same time the electrical lines and wires transmit the electrical response signals generated after illumination of the device with a pulse of electro-magnetic radiation.

Further electronic processing can be realized by simply connecting the read-out pads 50 with each other and then connecting with an electronic circuit for detecting the electrical signals. Alternatively the read-out pads 50 may respectively be connected with an electronic buffer or repeater and thereafter connecting the outputs of the buffers or repeaters to supply the summed output to an electronic circuit.

Figure 8:
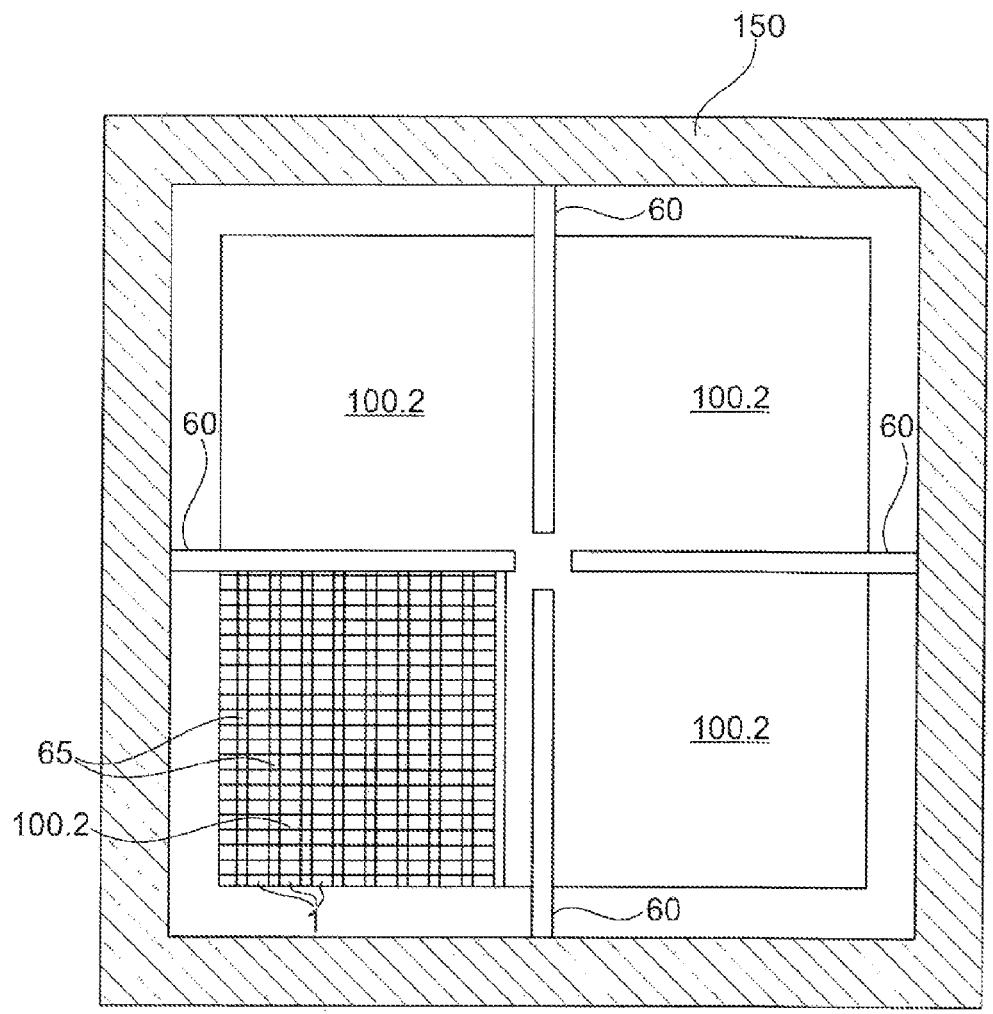
FIG. 8 illustrates a schematic top view representation of a silicon-based photoelectric multiplier according to an embodiment.

Referring to FIG. 8, there is shown a schematic top view representation of a silicon-based photoelectric multiplier according to an embodiment. This embodiment differs from the embodiment shown in FIG. 1 in that it does not provide read-out pads but instead a contiguous ring-like electrical line 150 which surrounds the matrix arrangement of cells 1 wherein respective electrical lines 60 can be connected with the ring-like line 150. The ring-like line 150 can be connected with an electronic circuit and it can have the same functions like the pads 50, i.e. supplying voltages to the cells and supplying the electrical signals to the electronic circuit for detecting and evaluating the electrical signals. The ring-like line 150 can have any desired form and shape. In case of a quadratic or rectangular shape of the matrix arrangement, the line 150 can have also quadratic or rectangular shape. In general, the shape of the line 150 may correspond to the shape of the matrix arrangement in order to save overall space of the detector. The line 150 can have equal distance to the matrix arrangement along the entire circumference of the line 150.

Figure 2:
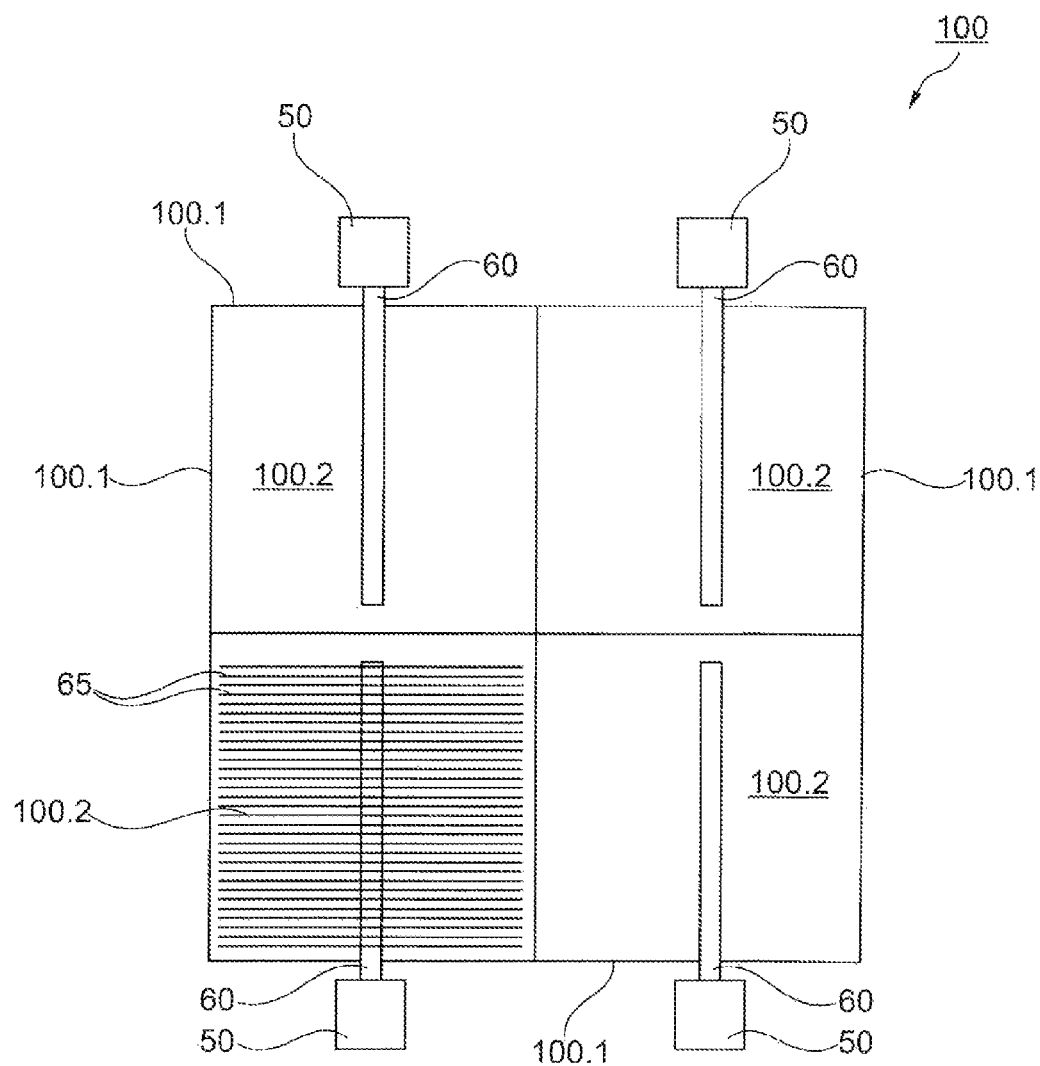
FIG. 2 illustrates a schematic top view representation of a silicon-based photoelectric multiplier according to an embodiment.

Referring to FIG. 2, there is shown a schematic top view representation of a silicon-based photoelectric multiplier according to an embodiment. This embodiment shows that the read-out pads 50 can be arranged in many different ways around the plurality of cells 1. The embodiment of FIG. 2 shows in principle a matrix arrangement 100 similar to that of FIG. 1. In a similar way as the embodiment of FIG. 1, the matrix arrangement 100 of FIG. 2 is split up in four segments 100.2. The difference between the embodiments of FIG. 1 and FIG. 2 is the way of electrically connecting the read-out pads 50 and the electrical lines 60 and the electrical wires 65 with the cells 1 of the respective segment 100.2. Whereas in the embodiment of FIG. 1 an electrical line 60 extends along one side edge of the segment 100.2 with which it is electrically connected, in the embodiment of FIG. 2 the electrical line 60 extends through the segment 100.2 so that the segment 100.2 in itself is split up into two halves. This would allow for even further reducing the distances between the cells 1 and their associated electrical line 60 and the read-out pad 50. For the purpose of simplicity, further details such as those shown in the embodiment of FIG. 1 are not shown in FIG. 2, including, for example, the electrical wires 65 connected with the electrical lines 60 for connecting with the individual cells 1. The embodiment shown in FIG. 2 can also be modified according to the embodiment of FIG. 8, i.e. by replacing the individual pads 50 with a contiguous electrical line 150 surrounding the matrix arrangement.

Figure 3:
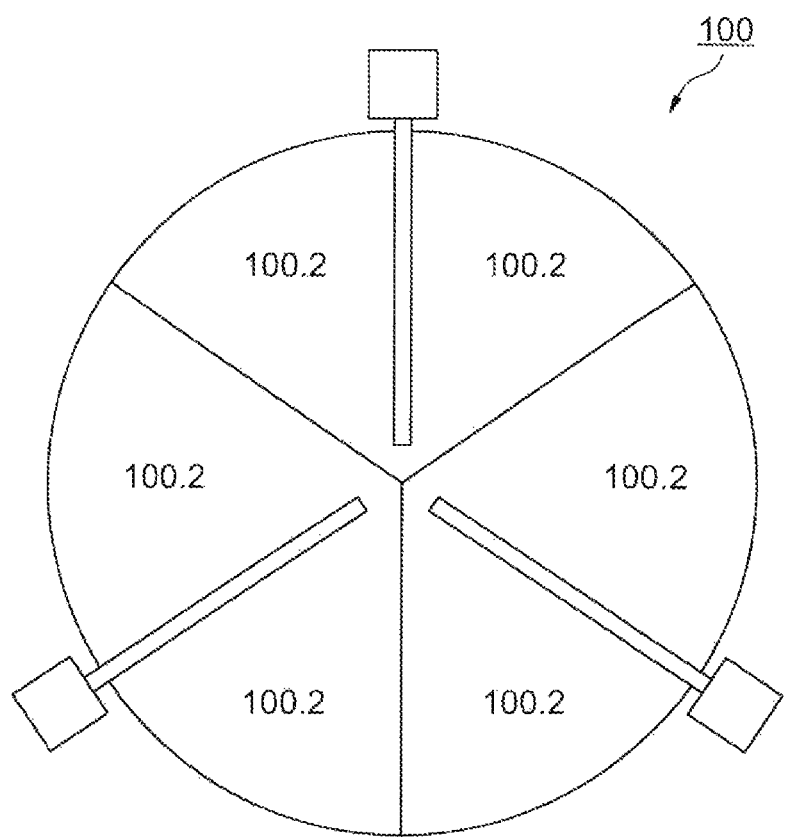
FIG. 3 illustrates a schematic top view representation of a silicon-based photoelectric multiplier according to an embodiment.

Referring to FIG. 3, there is shown a schematic top view representation of a silicon-based photoelectric multiplier according to another embodiment. This embodiment shows that there is no principle necessity to arrange the cells 1 of the device in a rectangular or quadratic manner. The embodiment of FIG. 3 shows that it is in principle also possible to arrange the cells in the form of a circle and/or one or more other non-rectangular and/or non-quadratic forms. For this particular embodiment three read-out pads 50 are distributed around the outer circumferential edge of the arrangement of cells 1 so that respective read-out pads 50 with their associated electrical line 60 serve an angular segment of 120° of cells 1. Similarly to the embodiment of FIG. 2, respective segments 100.2 are divided by the associated electrical line into two halves so that cells 1 of the respective two halves are electrically connected with the respective electrical line. Further details are omitted here and can be provided in a similar manner as in the previous embodiments, for example electrical wires 65 connected with the electrical lines. The embodiment shown in FIG. 3 can also be modified according to the embodiment of FIG. 8, i.e. by replacing individual pads with a contiguous electrical line 150 surrounding the matrix arrangement. In this case the line 150 can have a circular shape.

Figure 4:
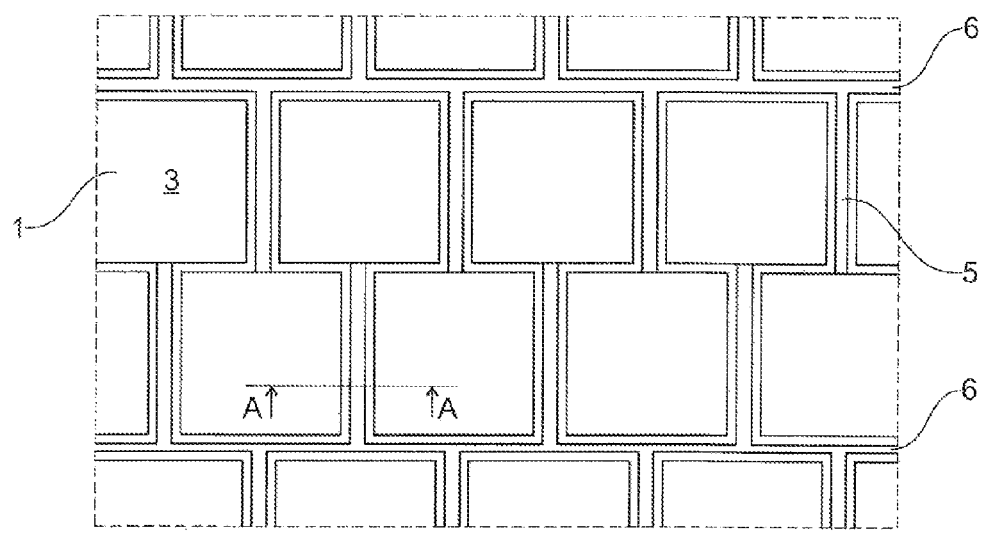
FIG. 4 illustrates a schematic top view representation of a section of a silicon-based photoelectric multiplier according to an embodiment.

Referring to FIG. 4, there is shown a top view representation of a section of a silicon-based photoelectric multiplier according to an embodiment. The device as shown in FIG. 4 is comprised of a plurality of cells 1. The cells 1 are arranged along rows wherein the cells 1 of one row are laterally displaced with respect to the cells 1 of an adjacent row wherein the displacement can be, for example, half the length of one side edge of a quadratically shaped cell 1. The device also comprises a plurality of voltage distribution lines 6 which may correspond with the electrical wires 65 as were shown in the embodiments of FIGS. 1, 2 and 8. In the section of the device as shown in FIG. 4 there are shown two voltage distribution lines 6 which are arranged along outer side edges of two adjacent rows of cells 1. The quenching resistor layers 5 of respective cells 1 of one row extend in the narrow space between two neighboring cells 1 of an adjacent row and are electrically connected with the voltage distribution line 6 extending along the adjacent row. The voltage distribution lines 6 can also be made of a well area formed within a layer. The voltage distribution lines 6 can be formed of well areas having a dopant concentration of about $10^{19}$ cm$^{-3}$ or $5 \times 10^{18}$ cm$^{-3}$ to $5 \times 10^{19}$ cm$^{-3}$ so that they function as conductive wires. Thus, the fabrication of the voltage distribution lines 6 can be made part of and embedded within a CMOS fabrication process.

Figure 5:
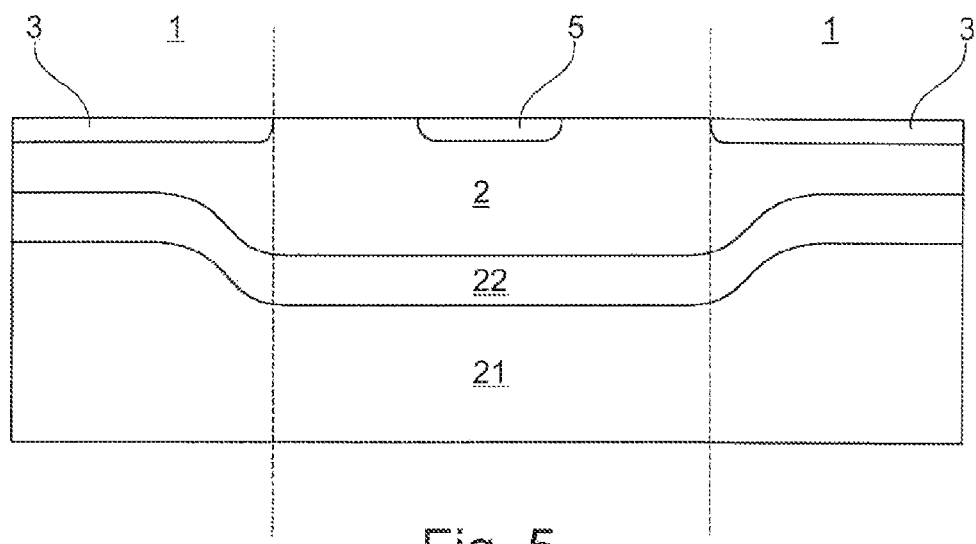
FIG. 5 illustrates a schematic cross-sectional representation of a silicon-based photoelectric multiplier according to an embodiment.

Referring to FIG. 5, there is shown a schematic cross-sectional representation along line A-A of FIG. 4 of the silicon-based photoelectric multiplier according to an embodiment.

The section of the photoelectric multiplier shown in FIG. 5 includes the right part of one cell 1 shown on the left side of the drawing and the left part of a further cell 1 shown on the right side of the drawing and a region in-between the adjacent cells 1, the region comprising a quenching resistor layer 5. The photoelectric multiplier comprises a substrate 21 of a second conductivity type having a relatively low doping agent concentration and a buried layer 22 of a first conductivity type which is obtained, for example, by high energy ion implantation. The substrate 21 and the buried layer 22 form a second n-p junction at an interface between them. Above the buried layer 22 the plurality of identical cells 1 is located, wherein respective cells 1 are formed by a first layer 2 and a second layer 3 wherein the first layer 2 is common for all cells 1 and is contiguous throughout the device. The second layer 3 is formed as a thin layer of second conductivity type and disposed on top of the first layer 2. The second layer 3 functions as an entrance window of the photoelectric multiplier. The first layer 2 and the second layer 3 form a first n-p junction at an interface between them, wherein in operation a reverse bias voltage is applied to the n-p junction to such an extent that the photo-diode operates in the Geiger mode. The thin strip-like silicon quenching resistor layers 5 of second conductivity type connect respective cells 1 with at least one of one or more voltage distribution lines and serve as quenching resistors. The voltage distribution lines are made of second conductivity type silicon layers having a relatively high doping agent concentration. The quenching resistor layers 5 are doped to have a resistivity in the range of 10 to 50 KOhm/square.

Figure 6:
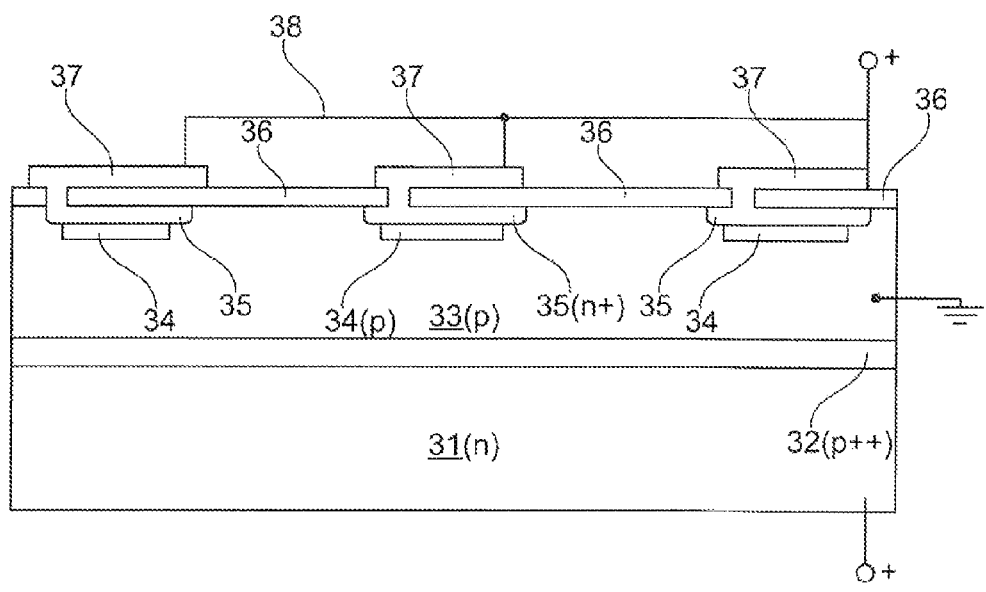
FIG. 6 illustrates a schematic cross-sectional side view representation of a cell of a silicon-based photoelectric multiplier according to an embodiment.

Referring to FIG. 6, there is shown a schematic cross-sectional side view representation of a silicon-based photoelectric multiplier according to an embodiment. The device as shown in FIG. 6 is not fabricated by a CMOS fabrication process. Instead the fabrication process starts from a light or medium n-doped silicon substrate 31 on the upper surface of which a heavily doped p++ layer 32 is generated by, for example, diffusion doping. Thereafter, a light or medium p-doped layer 33 is epitaxially grown onto the second layer 32. Within the epitaxially grown layer 33 a p-doped layer 34 (first layer) and a n+ layer 35 (second layer) are embedded so that they form a first n-p junction in the vicinity of the surface of the cell. Thereafter, on top of the layer 35 an insulation layer 36 is deposited which can be fabricated of a silicon oxide layer. A through-hole is formed in the insulation layer 36 at one end of it so that later the layer 35 can be electrically contacted. Thereafter, a resistor layer 37 is deposited on the insulating layer 36 wherein the resistor layer 37 can be fabricated of undoped or lightly doped polysilicon. The resistor layer 37 acts as a quenching resistor to quench the Geiger discharge. Thereafter, the resistor layers 37 of the cells 1 are connected with a voltage distribution line 38 which corresponds to one of the electrical wires 65 as were shown in the embodiments of FIGS. 1, 2 and 8.

Figure 7:
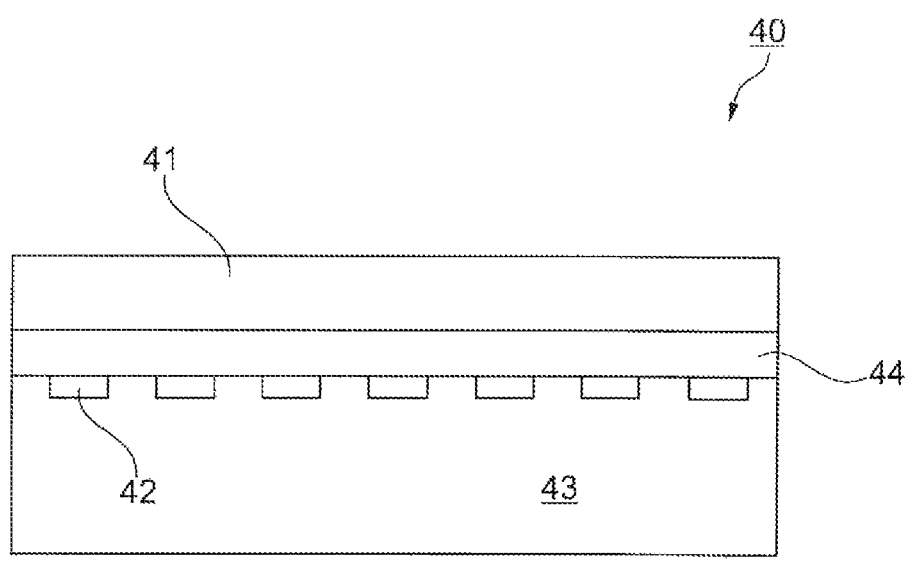
FIG. 7 illustrates a schematic cross-sectional side view representation of a radiation detector according to an embodiment.

Referring to FIG. 7, there is shown a cross-sectional side view representation of a radiation detector according to an embodiment. The radiation detector 40 includes a scintillator 41 that produces a scintillation or burst of light when a gamma-ray strikes the scintillator 41. The burst of light is received by an array of silicon-based photoelectric multipliers 42 as described above, the multipliers being monolithically disposed on a silicon substrate 43. The material of the scintillator 41 can be at least one of LSO, LYSO, MLS, LGSO, LaBr and mixtures thereof. Also other scintillator materials can be used. The scintillator 41 can be composed of a single crystal or an array of crystals. In addition, an optional planar light pipe 44 can be interposed between the scintillator 41 and the multipliers 42 to improve the transmission of photons of the light bursts to the multipliers 42.

Since the respective multipliers 42 are configured according to the disclosed subject matter and thus operates with an improved time resolution, the electronic circuit connected to the multipliers 42 and thus the radiation detector 40 is able to detect bursts of light closely followed one after the other with satisfying time resolution.

A plurality of radiation detectors 40 as shown in FIG. 7 can be arranged within a positron emission tomography (PET) imaging system.

While the disclosed subject matter has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosed subject matter.

What is claimed is:

1. A silicon-based photoelectric multiplier, comprising:
   a plurality of silicon-based cells, the plurality of silicon-based cells being fabricated on one common silicon substrate and respective silicon-based cells comprising a first semiconductor layer of a first conductivity type and a second semiconductor layer of a second conductivity type, the second semiconductor layer formed on the first semiconductor layer, wherein the first semiconductor layer and the second semiconductor layer form a first p-n junction, where:
   the plurality of silicon-based cells is divided into a number of segments, respective segments including a sub-plurality of silicon-based cells;
   a plurality of read-out lines are electrically connected with one or more silicon-based cells of at least one segment; and
   a contiguous and closed ring-like electrical line surrounds the plurality of silicon-based cells so that respective silicon-based cells of the plurality of silicon-based cells are arranged inside the ring-like electrical line and the plurality of read-out lines are electrically connected with the ring-like electrical line, where all silicon-based cells in the photoelectric multiplier are surrounded by the ring-like electrical line.

2. The silicon-based photoelectric multiplier of claim 1, wherein the first p-n junction is separate from the common silicon substrate and is configured to separate charge carriers generated by illumination of the silicon-based photoelectric multiplier with electro-magnetic radiation.

3. The silicon-based photoelectric multiplier of claim 1, respective read-out lines electrically connected with a plurality of electrical wires, respective electrical wires electrically connected with a particular number of silicon-based cells.

4. The silicon-based photoelectric multiplier of claim 1, the read-out lines electrically connected with one or more silicon-based cells of merely one segment, the read-out lines extending along a side edge of the merely one segment or through the merely one segment.

5. The silicon-based photoelectric multiplier of claim 1, respective silicon-based cells comprising a quenching resistor electrically connected with one of the read-out lines.

6. The silicon-based photoelectric multiplier of claim 1, where the ring-like electrical line is a non-segmented electrical line.

7. The silicon-based photoelectric multiplier of claim 1, where the ring-like electrical line is configured to supply a voltage to the plurality of silicon-based cells and to supply electrical signals from the plurality of silicon-based cells to an electronic circuit for detecting and evaluating the electrical signals.

8. The silicon-based photoelectric multiplier of claim 1, where the ring-like electrical line is not configured to emit light.

9. A silicon-based photoelectric multiplier, comprising:
   a plurality of silicon-based cells, the plurality of silicon-based cells being fabricated on one common silicon substrate and respective silicon-based cells comprising a first semiconductor layer of a first conductivity type and a second semiconductor layer of a second conductivity type, the second semiconductor layer formed on the first semiconductor layer, wherein the first semiconductor layer and the second semiconductor layer form a first p-n junction, where:
   the plurality of silicon-based cells is divided into a number of segments, respective segments including a sub-plurality of silicon-based cells;
   a plurality of read-out lines are electrically connected with one or more silicon-based cells of at least one segment; and
   a contiguous and closed ring-like electrical line surrounds the plurality of silicon-based cells so that respective silicon-based cells of the plurality of silicon-based cells are arranged inside the ring-like electrical line and the plurality of read-out lines are electrically connected with the ring-like electrical line, where all silicon-based cells in the photoelectric multiplier are surrounded by the ring-like electrical line, wherein the ring-like electrical line is only configured to supply a voltage to the plurality of silicon-based cells and to supply electrical signals from the plurality of silicon-based cells to an electronic circuit for detecting and evaluating the electrical signals.

10. The silicon-based photoelectric multiplier of claim 9, wherein the first p-n junction is separate from the common silicon substrate and is configured to separate charge carriers generated by illumination of the silicon-based photoelectric multiplier with electro-magnetic radiation.

11. The silicon-based photoelectric multiplier of claim 9, respective read-out lines electrically connected with a plurality of electrical wires, respective electrical wires electrically connected with a particular number of silicon-based cells.

12. The silicon-based photoelectric multiplier of claim 9, the read-out lines electrically connected with one or more silicon-based cells of merely one segment, the read-out lines extending along a side edge of the merely one segment or through the merely one segment.

13. The silicon-based photoelectric multiplier of claim 9, respective silicon-based cells comprising a quenching resistor electrically connected with one of the read-out lines.

14. The silicon-based photoelectric multiplier of claim 9, where the ring-like electrical line is a non-segmented electrical line.

15. The silicon-based photoelectric multiplier of claim 9, where the ring-like electrical line is not configured to emit light.

16. A silicon-based photoelectric multiplier, comprising:
a plurality of silicon-based cells, the plurality of silicon-based cells being fabricated on one common silicon substrate and respective silicon-based cells comprising a first semiconductor layer of a first conductivity type and a second semiconductor layer of a second conductivity type, the second semiconductor layer formed on the first semiconductor layer, wherein the first semiconductor layer and the second semiconductor layer form a first p-n junction, where:
the plurality of silicon-based cells is divided into a number of segments, respective segments including a sub-plurality of silicon-based cells;
a plurality of read-out lines are electrically connected with one or more silicon-based cells of at least one segment; and
a number of read-out pads, each one of the read-out pads being electrically connected with one read-out line,
wherein the read-out pads are only configured to supply a voltage to the plurality of silicon-based cells and to supply electrical signals from the plurality of silicon-based cells to an electronic circuit for detecting and evaluating the electrical signals.

17. The silicon-based photoelectric multiplier of claim 16, wherein the first p-n junction is separate from the common silicon substrate and is configured to separate charge carriers generated by illumination of the silicon-based photoelectric multiplier with electro-magnetic radiation.

18. The silicon-based photoelectric multiplier of claim 16, respective read-out lines electrically connected with a plurality of electrical wires, respective electrical wires electrically connected with a particular number of silicon-based cells.

19. The silicon-based photoelectric multiplier of claim 16, the read-out lines electrically connected with one or more silicon-based cells of merely one segment, the read-out lines extending along a side edge of the merely one segment or through the merely one segment.

20. The silicon-based photoelectric multiplier of claim 16, respective silicon-based cells comprising a quenching resistor electrically connected with one of the read-out lines.

* * * * *